United States Patent [19]

Sheard

[11] 3,872,360

[45] Mar. 18, 1975

[54] CAPACITORS WITH NICKEL CONTAINING ELECTRODES

[75] Inventor: John Leo Sheard, Williamsville, N.Y.

[73] Assignee: E. I. du Pont de Nemours and Company, Wilmington, Del.

[22] Filed: Jan. 8, 1973

[21] Appl. No.: 321,581

[52] U.S. Cl. .......... 317/258, 106/1, 117/227, 252/513, 252/514

[51] Int. Cl. .......... H01g 1/01

[58] Field of Search .......... 317/258; 106/1; 252/513, 252/514; 75/172 R; 161/196; 117/227

[56] References Cited

UNITED STATES PATENTS 3,232,886 2/1966 Hoffman .......... 252/514

3,484,284 12/1969 Dates .......... 106/1 X

OTHER PUBLICATIONS

Maitrepierre, Electrical Resistivity of Amorphous Ni–Pd–P Alloys, Journal of Applied Physics, Vol. 41, No. 2, 2–70.

*Primary Examiner*—E. A. Goldberg

[57] ABSTRACT

Metallizations for formation of conductors on substrates, comprising (1) nickel or nickel-containing base metal alloys, and (2) noble metals, e.g., palladium, palladium/gold, platinum/palladium/gold, and palladium/silver, wherein the ratio of nickel or nickel-containing alloy to noble metal is up to 1/1 (by weight). The metallization are used as conductors on ceramic substrates and for ceramic capacitors.

12 Claims, 1 Drawing Figure

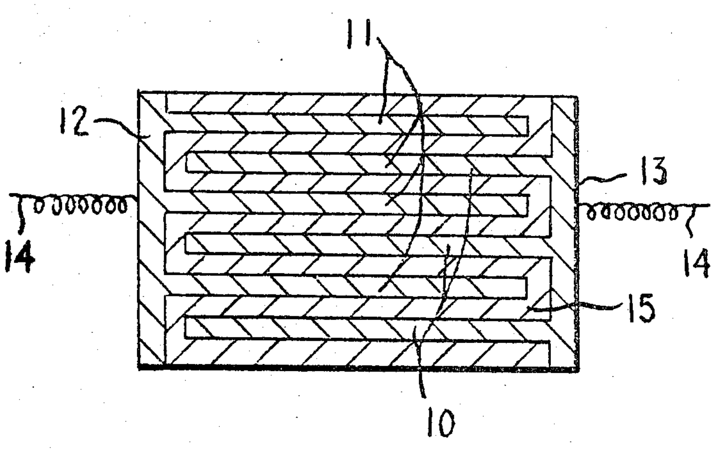
11
12
13
14
14
15
10

CAPACITORS WITH NICKEL CONTAINING ELECTRODES

BACKGROUND OF THE INVENTION

This invention relates to metallizations for electronic circuitry, and, more particularly, to improved metallizations for producing conductor patterns.

Metallizations useful in producing conductors for electronic circuitry comprise finely divided metal particles, and are often applied to dielectric substrates in the form of a dispersion of such particles in an inert liquid vehicle. Selection of the composition of the metal particles is based on a compromise of cost and performance. Performance normally requires the use of the noble metals, due to their relative inertness during firing on dielectric substrates to produce electrically continuous conductors, since non-noble metals often react with the dielectric substrate during firing. This problem of reactivity is aggravated when electrode and substrate are cofired, that is, when metal patterns are deposited on green (unfired) ceramic sheets and the entire assembly is cofired. However, among the noble metals, silver and gold melt quite low (960°C. and 1,063°C., respectively) and, hence, preclude the economy of simultaneously cosintering the dielectric substrate conductor pattern thereon, since the commonly used dielectric materials sinter at high temperatures, that is, above 1,100°C. (e.g., $BaTiO_3$ sinters at about 1,350°C. and $Al_2O_3$ at about 1,600°C.). Melting of the conductor pattern results in formation of discontinuous globules of metal. Palladium (m.p. 1,555°C.) and platinum (m.p. 1,774°C.) possess obvious advantages over gold and silver in this respect, among the more abundant noble metals.

Despite the obvious performance advantage in using noble metals, cost of those metals is a distinct drawback. Palladium and platinum are desirable as the principal or sole metals in the conductor metallizations for the electrode of the present invention. Palladium and platinum are, however, much more expensive than base metals such as nickel or nickel-containing alloys; hence, a metallization employing palladium, palladium/gold, platinum/palladium/gold, palladium/silver, platinum/silver or platinum, diluted by nickel or alloyed nickel, but not suffering from diminution in performance characteristics (e.g., low melting point, poor conductivity, poor adhesion to the substrate, reactivity to the substrate, instability in air during firing above 1,100° C.) is a significant technical goal.

The cost-performance balance mentioned above often results in the dilution of the conductor metal in the metallization with a nonconducting inorganic binder, such as glass frit, $Bi_2O_3$, etc., to increase the adhesion of the sintered conductor to the substrate. A system which does not require the use of such a nonconducting binder to achieve good conductor bonding to substrate is desirable.

The above properties are especially desired in a low-cost, high-performance metallization for use as an inner electrode in the formation of monolithic multilayer capacitors, comprising a multiple number of alternating conductor and dielectric layers, such as those of U.S. Pat. No. 3,456,313. Applicant has accordingly invented such a low-cost, palladium or platinum based, fritless, high-performance metallization.

SUMMARY OF THE INVENTION

The term "metallization" as applied to the present invention refers to a powder of finely divided noble metal and nickel or nickel-containing alloys, as more fully set forth herein. The finely divided powder is suitable for dispersion in an inert liquid vehicle to form a "metallizing composition." The latter is useful to print desired electrode patterns on dielectric substrates which upon firing produce conductors.

This invention provides improved metallizations useful for formation of conductors on dielectric substrates (prefired or unfired substrates), comprising (*a*) palladium, palladium/gold, platinum/palladium/gold, palladium/silver, platinum/silver or platinum and (*b*) nickel or nickel-containing alloys, the weight ratio of nickel or nickel-containing alloys to noble metal being up to 1/1. The metal particles are of such a size that 90% of the particles are not greater then 50 microns; also dispersions of such metallizations in an inert liquid vehicle. Also, metallizations of 0–99 parts Pd, 0–95 parts Au, 0–99 parts Pt, and 0–80 parts Ag, and 1–50 parts nickel or nickel-containing alloys.

Also provided are dielectric substrates having such metallizations fired thereon and capacitors thereof.

BRIEF DESCRIPTION OF THE DRAWING

FIG. 1 illustrates a multilayer capacitor of the invention having conductive electrodes of the composition of the invention.

DETAILED DESCRIPTION

The electrode metallizations of the present invention provide useful electrodes at high firing temperatures, cofireable with conventional green dielectrics, in addition to significant cost savings by virtue of the substitution of nickel or nickel-containing alloy for noble metals.

FIG. 1 illustrates a multilayer capacitor of the invention having a plurality of electrodes 10 and 11 connected to contact electrodes 12 and 13, respectively, with contact element 14 attached thereto. The capacitor electrodes 10 and 11 are separated by a ceramic dielectric material 15.

The addition of nickel or nickel-containing alloy to electrode metallizations does not merely provide cheaper effective metallizations by partial replacement of noble metals. As shown in the examples herein, there seems to be a synergistic effect, at least at certain metal concentrations, in the metallizing compositions of the present invention. Thus, it is shown that at certain Pd concentrations (33% in Example III), a useful capacitor electrode was not formed, whereas by the addition in Example III of 12% nickel-containing alloys to the 33% Pd, an effective capacitor was formed. (At higher concentrations of metal (e.g., 45%) the Pd system did produce useful capacitors.)

When it is said herein that nickel and/or nickelcontaining alloys may be substituted for noble metals in metallizations or metallizing compositions, it is meant that nickel and/or nickel-containing alloys may be used in conjunction with palladium, palladium/gold, platinum/palladium/gold, palladium/silver, platinum/silver or platinum, e.g., 25/75 Pd/Au, 40/20/40 Pt/Pd/Au, 40/60 Pd/Ag, 40/60 Pt/Ag.

In substituting nickel for noble metal in the present invention, one will balance the amount of nickel or alloy present against the properties desired in the conductor. Generally, a useful upper limit on the amount of nickel or nickel alloy is a weight ratio (as metal) of about 1/1 (by weight), although in some instances the substrate employed may dictate the use of a much lower ratio. A preferred ratio is in the range 0.5/1 – 0.1/1. Generally, no practical advantage is observed where the ratio is less than 0.1/1, although this is not intended to be limiting. Where Pd and amounts of other noble metals are present, the maximum ratio of nickel or nickel alloy to Pd plus such other noble metals likewise will be about 1/1.

Nickel and nickel-containing alloys suitable for use in the compositions of the invention are available commercially in finely divided form as nickel powder or as nickel/chromium, nickel/iron, nickel/chromium/iron alloy powders. These alloy powders may further include additional constituent elements, e.g., manganese, molybdenum, silicon, etc.

The metallizations should be finely divided to facilitate sintering and any reactions which occur. Furthermore, in the production of multilayer capacitors from green ceramic sheets, the presence of coarse particles as part of inner electrode prints would puncture the green dielectric sheets. Generally, the metallizations are such that at least 90% of the particles are no greater than 50 microns. In optimum metallizations substantially all the particles are less than 1 micron in size. Stated another way, the surface area of the particles is in the range 0.01–9 $m^2/g.$, preferably 0.1–8 $m^2/g$.

Finely dividied barium titanate may optionally be added to these metallizations, at levels up to about 10%, for the purpose of enhancing adherence of the metallization to the substrate and film continuity.

The metallizing compositions are prepared from the solids and vehicles by mechanical mixing. The metallizing compositions of the present invention are printed as a film onto ceramic dielectric substrates in the conventional manner. Generally, screen stenciling techniques are preferably employed. The metallizing composition may be printed either dry or in the form of a dispersion in an inert liquid vehicle.

Any inert liquid may be used as the vehicle. Water or any one of various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, $\alpha$- and $\beta$-terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate. Alternately, the vehicle may contain waxes, thermoplastic resins or like materials which are thermofluids, so that the vehicle containing metallizing composition may be applied at an elevated temperature to a relatively cold ceramic body upon which the metallizing composition sets immediately.

The ratio of inert vehicle to solids (glass-ceramic and metal) in the metallizing compositions of this invention may vary considerably and depends upon the manner in which the dispersion of metallizing composition in vehicle is to be applied and the kind of vehicle used. Generally, from 0.5 to 5 parts by weight of solids per part by weight of vehicle will be used to produce a dispersion of the desired consistency. Preferably, 0.6–2.0 parts of solid per part of vehicle will be used. Optimum dispersions contain 40–60% liquid vehicle.

As indicated above, the metallizing compositions of the present invention are printed onto ceramic substrates, after which the printed substrate is fired to mature the metallizing compositions of the present invention, thereby forming continuous conductors. Although considerable advantage is afforded by the present invention where the compositions are printed on green ceramics and cofired therewith, this invention is not limited to that embodiment. The compositions of the present invention invention may be printed on prefired (cured) ceramics if so desired.

Although the printing, dicing, stacking and firing techniques used in multilayer capacitor manufacture vary greatly, in general the requirements for a metallizing composition used as an electrode are (1) reasonable (2 hours or less) drying time, (2) nonreactivity with green ceramic binders (reaction causes "curling" or even hole formation during printing and drying), (3) nonreactivity with ceramic components during firing (e.g., Pd reaction with bismuth causing shattering of capacitors), (4) stability during firing in air (i.e., does not become nonconductive), and (5) non-melting under peak firing conditions.

After printing of the electrode onto the green ceramic, the resulting pieces are then either dry or wet stacked to the appropriate number of layers (normally anywhere from 5 to 60 depending upon design), pressed (up to 3,000 psig with or without heat) and diced.

A typical firing cycle for multilayer capacitors comprising two phases. The first, which may last up to several days, is called bisquing. Maximum temperature reached may be anywhere from 300°–500°C. (600°–1,000°F). The purpose is the noncatostropic removal of organic binder both in the electrodes and the green sheets. After this is accomplished a rapid (6 hours or less) heat up to the desired "soaking" temperature for maturing of the ceramic takes place. Soaking temperature depends upon the composition of the ceramic. In general, with $BaTiO_3$ as the main component, soaking temperatures range from 1,240°C. to 1,400°C. (2,265°F. to 2,550°F.). Rate of cool down of the parts after soaking depends upon thermal shock considerations.

EXAMPLES

The following examples and comparative showings are presented to illustrate the advantages of the present invention. In the examples and elsewhere in the specification and claims, all parts, percentages, proportions, etc., are by weight.

Effective dielectric constant (effective K) and dissipation factor were determined as follows. The fired three-layer (two buried electrodes) capacitors were mounted in the jaws of an automatic RLC Bridge (General Radio Model No. 1683) where both capacitance and D.F. were automatically read. Knowing the capacitance, dimensions of electrode and thickness of fired dielectric, effective K was determined from:

Effective K = (reading in picofarads)(thickness)(2.9 $\times 10^{-2}$/area of electrode thickness being in mils and area in square centimeters.

Resistivity was determined on 1-mil thick elements.

In the examples and comparative showings, all inorganic solids are finely divided; the maximum particle size was less than 50 microns.

EXAMPLE I

This example illustrates the effect and electrical properties of the nickel or nickel-containing alloys as diluents with finely divided palladium powder (5 $m^2/g$) metallizing compositions and demonstrates that said effect and properties are attributable to the nickel present.

First control samples of finely divided palladium powder were mixed together with a vehicle and then roll milled to give a homogeneous dispersion. The resultant metallizing compositions having varying amounts of palladium were screen printed through a 325 mesh screen (U.S. Standard Screen Scale) onto 96% $Al_2O_3$ chips in test patterns of 400 $cm^2$, the pattern being sepentine in shape. The samples were dried at 150°C. for 15 minutes and fired at the time and temperature indicated below. After cooling the resistance of the samples were measured and recorded.

Test samples (1–8) of the compositions of the invention were prepared having indicated parts by weight of palladium powder and 12 parts by weight of nickel and nickel-containing alloys in finely divided powder form, and printed and fired as described above.

Additional samples (A–F) of compositions were prepared, having indicated parts by weight finely divided palladium powder (5$m^2/g$) and 12 parts by weight of base metal and base metal alloy powder not containing nickel, printed and fired as described above.

The vehicle for all the above compositions was kerosene based and included resin, ethyl hydroxyethyl cellulose, naptha and terpineol in suitable proportions to provide a screen printable composition.

EXAMPLE II

This example illustrates the use of palladium/gold metallizing compositions, having nickel and nickel-containing alloy diluents, as an electrode on an unfired (green) ceramic substrate containing bismuth.

Substrates were prepared from six pieces of 2 inch × 2 inch × 3 mil inch unfired sheet (green) containing bismuth by pressing the pieces together, the resulting substrate was approximately 18 mils in thickness fo: ease of handling.

A metallizing composition of 75/25 gold palladium was prepared, the finely divided gold palladium powder having a surface area 9 $m^2/g.$, according to the procedure of Example I, using the vehicle of that example. The compositions were screen printed on the substrates using a 325 mesh screen in a pattern of one-fourth inch wide × 1¾ inch long bands. The printed substrates were dried at 150°C. for 15 minutes, fired at 500°C. for 16 hours and then brought up to a peak fire of 1,250°C. for 2 hours. The resultant electrodes were examined and the resistance measured.

Sample electrodes 1–4 were prepared using the compositions of the invention with the nickel-containing alloys as a diluent in the palladium gold metallization according to the same procedure as above.

| SAMPLE | COMPOSITION | RESISTANCE |
|---|---|---|
| Control | 50% Pd/Au | 0.5 |
| Control | 40% Pd/Au | ∞ |
| 1 | 30% Pd/Au, 20% 75/8/15 Ni/Fe/Cr alloy, (−325 mesh) | 8.0 |
| 2 | 40% Pd/Au, 10% 75/8/15 Ni/Fe/Cr alloy (−325 mesh) | 0.5 |

| SAMPLE | COMPOSITION | PEAK FIRING TEMPERATURE | PEAK FIRING TIME | RESISTANCE (Ohms/$cm^2$) |
|---|---|---|---|---|
| Control | 50% Pd | 1270°C. | 30 min. | 0.25 |
| Control | 40% Pd | " | " | 0.40 |
| Control | 33% Pd | " | " | ∞ |
| 1 | 33% Pd, 12% Ni (1–10μ) | " | " | 2.0 |
| 2 | 33% Pd, 12% 80/20 Ni/Cr alloy (−325 mesh) | " | " | 0.9 |
| 3 | 33% Pd, 12% 49/51 Ni/Fe alloy (−325 mesh) | " | " | 7.1 |
| 4 | 33% Pd, 12% 75/8/15 Ni/Fe/Cr alloy (325 mesh) | " | " | 0.7 |
| 5 | 36% Pd, 14% 75/8/15 Ni/Fe/Cr alloy (−325 mesh) | " | " | 0.4 |
| 6 | 25% Pd, 25% 75/8/15 Ni/Fe/Cr alloy (−325 mesh) | " | " | 0.38 |
| Control | 0% Pd, 50% 75/8/15 Ni/Fe/Cr alloy (−325 mesh) | " | " | ∞ |
| 7 | 33% Pd, 17% 11/70/19 Ni/Fe/Cr alloy (−325 mesh) | " | " | 10.2 |
| 8 | 33% Pd, 12% 36/64 Ni/Fe alloy (−325 mesh) | " | " | 2.6 |
| A | 33% Pd, 12% 65/35 Fe/Cr Alloy (−325 mesh) | " | " | 900 |
| B | 33% Pd, 12% 17/82 Cr/Fe alloy (−325 mesh) | " | " | ∞ |
| C | 33% Pd, 12% cobalt powder (−325 mesh) | " | " | ∞ |
| D | 33% Pd, 12% iron powder (−325 mesh) | " | " | ∞ |
| E | 20% Pd, 25% silver powder (1.4 $m^2/g$) | " | " | ∞ |
| F | 33% Pd, 12% chromium powder (−325 mesh) | " | " | ∞ |

-Continued

| SAMPLE | COMPOSITION | RESISTANCE |
|---|---|---|
| 3 | 40% Pd/Au, 10% 36/64 Ni/Fe alloy (−325 mesh) | 0.6 |
| 4 | 40% Pd/Au, 10% 80/20 Ni/Cr alloy | 0.6 |

EXAMPLE III

This example illustrates the use of the compositions of the invention for electrodes in a single layer capacitor.

Control sample capacitors were prepared using a one-half inch diameter disc of unfired sheet (green) formed from two approximately 2–3 mil thick green sheets pressed together to form a dielectric of approximately 6 mils unfired thickness. Electodes were printed on the disc using a 200 or 325 screen, a three-eighths inch filled circle on one side of the disc and a one-fourth inch filled circle on the other side of the disc as recited in Example I using the vehicle of that example. The printed disc was dried at 150°C. for 15 minutes, bisqued at 500°C. for 16 hours, and fired at the indicated temperature for a soak time of 1 hour.

Single layer capacitors were prepared using the metallizing compositions of this invention comprising finely divided palladium powder and nickel-containing alloy diluent.

After cooling the capacitors were electrically and microscopically examined.

| SAMPLE | COMPOSITION | PEAK FIRING TEMPERATURE | EFFECTIVE K | D.F. | RESISTANCE (Ohms/cm²) |
|---|---|---|---|---|---|
| Control | 50% Pd (200 mesh) | 1320°C. | 4990 | 1.0 | 0.5 |
| Control | 40% Pd (200 mesh) | " | 2382 | 0.8 | 1.1 |
| Control | 33% Pd (200 mesh) | " | None, open circuit | | |
| 1 | 33% Pd, 16% 75/8/15 Ni/Fe/Cr alloy (1–10μ) | " | 2662 | 1.0 | 1.4 |
| 2 | 33% Pd, 12% 78/8/15 Ni/Fe/Cr alloy (1–10μ) | " | 3510 | 0.8 | 1.5 |
| 3 | 33% Pd, 12% 75/8/15 Ni/Fe/Cr alloy (−325 mesh) | " | 4610 | 0.8 | 1.3 |
| 4 | 25% Pd, 25% 75/8/15 Ni/Fe/Cr alloy (−325 mesh) | " | 3147 | 1.3 | 6.3 |
| 5 | 33% Pd, 12% 80/20 Ni/Cr alloy (1–10μ) | " | 2200 | 1.7 | — |

EXAMPLE IV

Three layer capacitors having buried electrodes were prepared from disc cut as in Example III from an unfired sheet (green). A four-square pattern was used for the electrodes. The bottom electrode was printed on the top surface of the unfired base disc using a 325 mesh screen. A dielectric unfired disc, having a V-notch at the edge to expose a portion of the electrode and provide an electrical contact point, was placed over the electrode on the base disc. The top electrode was printed on the upper surface of the second layer dielectric disc perpendicular to the bottom electrode. Another disc having a V-notch at the edge rotated 90° from the V-notch of the bottom disc, was placed over the second layer dielectric and second electrode to form the third layer of the capacitor. The three layers were pressed together then dried and fired at 1,320°C. according to the procedure of Example III to produce a capacitor. Control sample capacitors were prepared using the palladium composition of Example III, and sample capacitors 1–3 were prepared using the metallizing compositions of the invention.

| SAMPLE | COMPOSITION | EFFECTIVE K | D.F. |
|---|---|---|---|
| Control | 50% Pd | 5000 | 1.3 |
| Control | 40% Pd | 1948 | 5.0 |
| 1 | 33% Pd, 12% 75/8/15 Ni/Fe/Cr alloy (1–10μ) | 3903 | 1.3 |
| 2 | 33% Pd, 12% 75/8/15 Ni/Fe/Cr alloy (−325 mesh) | 4619 | 1.5 |
| 3 | 25% Pd, 25% 75/8/15 Ni/Fe/Cr alloy (−325 mesh) | 2838 | 2.0 |

X-ray analysis of the fired electrodes showed no interaction between the palladium and inconel, but indicated some formation of NiO.

EXAMPLE V

Sample capacitors were prepared according to the procedure of Example IV, using 1/3 Pd/Au alloy for the control samples, and samples 1–4 of 1/3 Pd/Au alloy and nickel-containing alloy diluent according to the compositions of this invention. Unfired sheet (green) containing bismuth were used for the three layers and firing was at 1,270°C. for a 2 hour soak.

| SAMPLE | COMPOSITION | EFFECTIVE K | D.F. |
|---|---|---|---|
| Control | 50% Pd/Au Alloy (−325 mesh) | 1288 | 1.2 |
| Control | 40% Pd/Au Alloy (−325 mesh) | 18 | 0.3 |
| 1 | 40% Pd/Au, 10% 75/8/15 Ni/Fe/Cr alloy (−325 mesh) | 1360 | 1.2 |
| 2 | 40% Pd/Au, 10% 36/64 Ni/Fe alloy (−325 mesh) | 953 | 0.8 |
| 3 | 40% Pd/Au, 10% 80/20 Ni/Cr alloy (−325 mesh) | 1392 | 0.9 |
| 4 | 30% Pd/Au, 20% 75/8/15 Ni/Fe/Cr alloy (−200 mesh) | 1208 | 1.1 |

What is claimed is:

1. A metallizing composition consisting essentially of finely divided noble metal(s) powder selected from the group consisting of gold, silver, platinum, palladium and mixtures thereof, an inert liquid vehicle, and a base metal diluent of one or more members selected from the group consisting of nickel and nickel-containing base metal alloys, the ratio of nickel to said noble metal being up to 1/1 by weight, the particles of said metallization being of a size such that at least 90% of said particles are not greater than 50$\mu$.

2. Metallizing compositions of claim 1, wherein the base metal diluent comprises at least 5% nickel by weight.

3. In a metallizing composition comprising finely divided noble metal(s) powder selected from the group consisting of gold, silver, platinum, palladium and mixtures thereof and an inert liquid vehicle, the improvement consisting essentially of base metal diluent which comprises 80 Ni/20 Cr alloy by weight, the particles of said metallization being of a size such that at least 90% of said particles are not greater than 50$\mu$.

4. In a metallizing composition comprising finely divided noble metal(s) powder selected from the group consisting of gold, silver, platinum, palladium and mixtures thereof and an inert liquid vehicle, the improvement consisting essentially of base metal diluent which comprises 49 Ni/51 Fe alloy by weight, the particles of said metallization being of a size such that at least 90% of said particles are not greater than 50$\mu$.

5. In a metallizing composition comprising finely divided noble metal(s) powder selected from the group consisting of gold, silver, platinum, palladium and mixtures thereof and an inert liquid vehicle, the improvement consisting essentially of base metal diluent which comprises 75 Ni/8 Fe/15 Cr alloy by weight, the particles of said metallization being of a size such that at least 90% of said particles are not greater than 50$\mu$.

6. In a metallizing composition comprising finely divided noble metal(s) powder selected from the group consisting of gold, silver, platinum, palladium and mixtures thereof and an inert liquid vehicle, the improvement consisting essentially of base metal diluent which comprises 11 Ni/70 Fe/19 Cr alloy by weight, the particles of said metallization being of a size such that at least 90% of said particles are not greater than 50$\mu$.

7. In a metallizing composition comprising finely divided noble metal(s) powder selected from the group consisting of gold, silver, platinum, palladium and mixtures thereof and an inert liquid vehicle, the improvement consisting essentially of base metal diluent which comprises 36 Ni/64 Fe alloy by weight, the particles of said metallization being of a size such that at least 90% of said particles are not greater than 50$\mu$.

8. Metallizing compositions of claim 1, additionally comprising up to 10% finely divided barium titanate.

9. Metallizing compositions according to claim 1 of 1–50 parts of a base metal diluent of one or more members selected from the group consisting of nickel and nickel-containing base metal alloys.

10. Metallizing compositions according to claim 9, wherein the base metal diluent comprises at least 5% nickel by weight of the composition.

11. A dielectric substrate having thereon a conductor of a metallization consisting essentially of finely divided noble metal(s) selected from the group consisting of gold, silver, platinum, palladium and mixtures thereof, and a base metal diluent of one or more members selected from the group consisting of nickel and nickel-containing base metal alloys, the ratio of nickel to noble metal being up to 1/1 by weight, the particles of said metallization being of a size such that at least 90% of said particles are not greater than 50$\mu$.

12. A multilayer capacitor having two or more electrodes of a metallization of finely divided noble metal(s) selected from the group consisting of gold, silver, platinum, palladium and mixtures thereof, the improvement consisting essentially of a base metal diluent of one or more members selected from the group consisting of nickel and nickel-containing base metal alloys, the ratio of nickel to noble metal being up to 1/1 by weight, the particles of said metallization being of a size such that at least 90% of said particles are not greater than 50$\mu$.

* * * * *